United States Patent
Kishimoto (10) Patent No.: US 10,491,181 B2
(45) Date of Patent: Nov. 26, 2019

(54) HIGH-FREQUENCY FILTER AND HIGH-FREQUENCY MODULE

(71) Applicant: Murata Manufacturing Co., Ltd., Kyoto (JP)

(72) Inventor: Ken Kishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/724,286

(22) Filed: Oct. 4, 2017

(65) Prior Publication Data

US 2018/0102752 A1   Apr. 12, 2018

(30) Foreign Application Priority Data

Oct. 7, 2016 (JP) ................................ 2016-198636
Aug. 31, 2017 (JP) ................................ 2017-166377

(51) Int. Cl.

| H03H 7/09 | (2006.01) |
|---|---|
| H03H 7/12 | (2006.01) |
| F02P 3/00 | (2006.01) |
| H01P 1/20 | (2006.01) |
| H01F 27/28 | (2006.01) |
| H01P 1/205 | (2006.01) |
| H03H 7/01 | (2006.01) |
| H03H 7/46 | (2006.01) |
| H01P 1/203 | (2006.01) |
| H03H 1/00 | (2006.01) |

(52) U.S. Cl.
CPC ............ *H03H 7/09* (2013.01); *F02P 3/005* (2013.01); *H01F 27/2804* (2013.01); *H01P 1/2002* (2013.01); *H01P 1/205* (2013.01); *H03H 7/0115* (2013.01); *H03H 7/12* (2013.01); *H03H 7/463* (2013.01); *H01P 1/20345* (2013.01); *H03H 2001/0085* (2013.01)

(58) Field of Classification Search
CPC ........... H03H 7/0115; H03H 7/09; H03H 7/12
USPC ................................. 333/175, 177, 185, 181
See application file for complete search history.

(56) References Cited

U.S. PATENT DOCUMENTS

| 4,355,352 A * | 10/1982 | Bloom | H02M 3/005 363/16 |
|---|---|---|---|
| 2007/0241838 A1* | 10/2007 | Suzuki | H02H 9/005 333/181 |
| 2009/0054749 A1* | 2/2009 | He | A61B 5/0002 600/316 |
| 2010/0157860 A1* | 6/2010 | Hagiwara | H04B 1/0057 370/310 |

FOREIGN PATENT DOCUMENTS

JP   2007-067941 A   3/2007

* cited by examiner

*Primary Examiner* — Rakesh B Patel
(74) *Attorney, Agent, or Firm* — Pearne & Gordon LLP (57) ABSTRACT

A high-frequency filter includes a first terminal, a second terminal, a third terminal, a first inductor, a second inductor, a third inductor, and a fourth inductor. The first inductor and the second inductor are connected in series to each other between the first terminal and the second terminal. The third inductor and the fourth inductor are connected in parallel to each other between the third terminal and a node of the first inductor and the second inductor. The connection between the first inductor and the second inductor is an additive polarity connection. The connection between the third inductor and the fourth inductor is an additive polarity connection.

16 Claims, 6 Drawing Sheets

HIGH-FREQUENCY FILTER AND HIGH-FREQUENCY MODULE

This application claims priority from Japanese Patent Application No. 2017-166377 filed on Aug. 31, 2017 and Japanese Patent Application No. 2016-198636 filed on Oct. 7, 2016. The content of each of these applications is incorporated herein by reference in its entirety.

BACKGROUND

The present disclosure relates to a high-frequency filter that passes therethrough a high-frequency signal of a desired frequency band and attenuates high-frequency signals of the other frequency bands.

High-frequency modules currently used in wireless communication terminals or the like include high-frequency filters. For example, Japanese Unexamined Patent Application Publication No. 2007-67941 describes a noise filter, which is a high-frequency filter. The noise filter described in Japanese Unexamined Patent Application Publication No. 2007-67941 includes a first inductor, a second inductor, a third inductor, and a capacitor.

The first inductor and the second inductor are connected in series to each other between a first terminal and a second terminal. One end of the third inductor is connected to a conductive line that connects the first inductor and the second inductor to each other. The other end of the third inductor is connected to one end of the capacitor. The other end of the capacitor is connected to another terminal. That is, the high-frequency filter is implemented as a T filter circuit including two series inductors (i.e., the first inductor and the second inductor), a shunt inductor (i.e., the third inductor), and a shunt capacitor (i.e., the capacitor).

In the case where a bandpass filter is constituted by the high-frequency filter having the circuit configuration described in Japanese Unexamined Patent Application Publication No. 2007-67941, the other end of the capacitor is conceivably connected to ground, for example.

To increase inductances of the series inductors in this configuration, the first inductor and the second inductor may be connected to have additive polarity. An additive polarity connection is a connection that produces a positive mutual inductance.

In this case, however, the resultant circuit configuration is such that an inductor having an inductance equal to the mutual inductance with the opposite sign (negative mutual inductance) of the first inductor and the second inductor is connected in series to the shunt inductor. Consequently, an inductance of the shunt LC circuit decreases, and filter characteristics deteriorate.

To increase an inductance of the shunt inductor, the first inductor and the second inductor may be connected to have subtractive polarity. A subtractive polarity connection is a connection that produces a negative mutual inductance. In this case, however, the inductances of the first inductor and the second inductor decrease by the mutual inductance, and filter characteristics deteriorate.

BRIEF SUMMARY

Accordingly, the present disclosure provides a high-frequency filter capable of suppressing a deterioration of filter characteristics while having a simple configuration.

According to embodiments of the present disclosure, a high-frequency filter includes a first terminal, a second terminal, a third terminal, a first inductor, a second inductor, a third inductor, and a fourth inductor. The first inductor and the second inductor are connected in series to each other between the first terminal and the second terminal. The third inductor and the fourth inductor are connected in parallel to each other between the third terminal and a line connecting the first inductor and the second inductor to each other. The connection between the first inductor and the second inductor is an additive polarity connection. The connection between the third inductor and the fourth inductor is an additive polarity connection. The configuration above is referred to as a first circuit configuration.

With this configuration, inductances of the first inductor and the second inductor increase by the magnitude of mutual coupling. Consequently, the quality factor (Q factor) of the first inductor and the Q factor of the second inductor increase. In addition, a mutual inductance of the third inductor and the fourth inductor reduces an increase in the negative inductance that is inserted in series to a parallel circuit of the third inductor and the second inductor due to mutual coupling between the first inductor and the second inductor.

In addition, the high-frequency filter according to embodiments of the present disclosure may have a configuration below. The high-frequency filter further includes a first capacitor, a second capacitor, a third capacitor, a fourth capacitor, and a fifth capacitor. The first capacitor is connected between the first inductor and the first terminal. The second capacitor is connected between the second inductor and the second terminal. The third capacitor is connected between the third terminal and a node of the first capacitor and the first inductor. The fourth capacitor is connected between the third terminal and a node of the second capacitor and the second inductor. The fifth capacitor is connected between the third terminal and a parallel circuit of the third inductor and the fourth inductor. The configuration above is referred to as a second circuit configuration.

With this configuration, the high-frequency filter has filter characteristics with a plurality of attenuation poles located outside the passband.

In addition, the high-frequency filter according to embodiments of the present disclosure may have a configuration below. The high-frequency filter includes a multilayer body including a plurality of dielectric layers stacked one on top of the other in a stacking direction, the multilayer body having a first principal surface and a second principal surface that are perpendicular to the stacking direction, and conductor patterns disposed in or on the multilayer body. The first terminal, the second terminal, the third terminal, the first inductor, the second inductor, the third inductor, and the fourth inductor are constituted by the conductor patterns. The first terminal is disposed at a portion of the multilayer body near the first principal surface. The second terminal is disposed at a portion of the multilayer body near the second principal surface. The third terminal is connected to conductor patterns for a reference potential among the conductor patterns. One end of the first inductor is connected to the first terminal. Another end of the first inductor is connected to one end of the second inductor, one end of the third inductor, and one end of the fourth inductor. Another end of the second inductor is connected to the second terminal. Another end of the third inductor and another end of the fourth inductor are connected to the conductor patterns for the reference potential. A direction of a magnetic flux produced by the first inductor is identical to a direction of a magnetic flux produced by the second inductor. A direction of a magnetic flux produced by the third inductor is identical to a direction of a magnetic flux produced by the fourth inductor.

With this configuration, the first circuit configuration described above is implemented by a multilayer body including conductor patterns.

In addition, the high-frequency filter according to embodiments of the present disclosure may have a configuration below. The first inductor and the second inductor have helical shapes having a winding axis in the stacking direction and have identical winding directions, and the third inductor and the fourth inductor have helical shapes having a winding axis in the stacking direction and have opposite winding directions.

With this configuration, the structure implementing the first circuit configuration described above is made compact.

In addition, the high-frequency filter according to embodiments of the present disclosure may have a configuration below. The high-frequency filter further includes a multilayer body including a plurality of dielectric layers stacked one on top of the other in a stacking direction, the multilayer body having a first principal surface and a second principal surface that are perpendicular to the stacking direction, and conductor patterns disposed in or on the multilayer body. The first terminal, the second terminal, the third terminal, the first inductor, the second inductor, the third inductor, the fourth inductor, the first capacitor, the second capacitor, the third capacitor, the fourth capacitor, and the fifth capacitor are constituted by the conductor patterns. The first terminal is disposed at a portion of the multilayer body near the first principal surface. The second terminal is disposed at a portion of the multilayer body near the second principal surface. The third terminal is connected to conductor patterns for a reference potential among the conductor patterns. The first capacitor includes a first planar conductor and a second planar conductor that are spaced apart from each other and are opposed to each other in the stacking direction. The second capacitor includes a third planar conductor and a fourth planar conductor that are spaced apart from each other and are opposed to each other in the stacking direction. The third capacitor includes a fifth planar conductor and a sixth planar conductor that are spaced apart from each other and are opposed to each other in the stacking direction. The fourth capacitor includes a seventh planar conductor and an eighth planar conductor that are spaced apart from each other and are opposed to each other in the stacking direction. The fifth capacitor includes a ninth planar conductor and a tenth planar conductor that are spaced apart from each other and are opposed to each other in the stacking direction. The first terminal is connected to the first planar conductor. One end of the first inductor is connected to the second planar conductor. Another end of the first inductor is connected to one end of the second inductor, one end of the third inductor, and one end of the fourth inductor. Another end of the second inductor is connected to the fourth planar conductor. The second terminal is connected to the third planar conductor. The fifth planar conductor is disposed on a side opposite to the second planar conductor with respect to the first planar conductor. The sixth planar conductor serves as the conductor pattern for the reference potential and is disposed on the first principal surface or disposed to be closer to the first principal surface than the fifth planar conductor is. The seventh planar conductor is disposed on a side opposite to the fourth planar conductor with respect to the third planar conductor. The eighth planar conductor serves as the conductor pattern for the reference potential and is disposed on the second principal surface or disposed to be closer to the second principal surface than the seventh planar conductor is. Another end of the third inductor and another end of the fourth inductor are connected to the ninth planar conductor. The tenth planar conductor serves as the conductor pattern for the reference potential and is disposed on the second principal surface or disposed to be closer to the second principal surface than the ninth planar conductor is. A direction of a magnetic flux produced by the first inductor is identical to a direction of a magnetic flux produced by the second inductor. A direction of a magnetic flux produced by the third inductor is identical to a direction of a magnetic flux produced by the fourth inductor.

With this configuration, the second circuit configuration described above is implemented by a multilayer body including conductor patterns.

In addition, the high-frequency filter according to embodiments of the present disclosure may have a configuration below. The first inductor and the second inductor have helical shapes having a winding axis in the stacking direction and have identical winding directions, and the third inductor and the fourth inductor have helical shapes having a winding axis in the stacking direction and have opposite winding directions.

With this configuration, the structure implementing the second circuit configuration described above is made compact.

In addition, in the high-frequency filter according to embodiments of the present disclosure, the ninth planar conductor may be disposed between the eighth planar conductor and the tenth planar conductor in the stacking direction.

With this configuration, coupling of the fifth capacitor to another circuit element is suppressed.

In addition, the high-frequency filter according to embodiments of the present disclosure may have a configuration below. In plan view of the multilayer body, the first planar conductor, the second planar conductor, the third planar conductor, and the fourth planar conductor are disposed between a region where the first inductor and the second inductor are disposed and a region where the third inductor and the fourth inductor are disposed.

With this configuration, the multilayer body is further made compact.

In addition, the high-frequency filter according to embodiments of the present disclosure may have a configuration below. The one end of the third inductor is connected to a node of the other end of the first inductor and the one end of the second inductor by a first wiring conductor pattern among the conductor patterns. The one end of the fourth inductor is connected to a node of the other end of the first inductor and the one end of the second inductor by a second wiring conductor pattern among the conductor patterns. The first wiring conductor pattern and the second wiring conductor pattern are disposed to be parallel to each other in the stacking direction.

With this configuration, a resistance of a connection between the circuit of the series inductors (series circuit of the first inductor and the second inductor) and the circuit of the shunt inductors (parallel circuit of the third inductor and the fourth inductor) decreases. In addition, the third inductor and the fourth inductor that are wound in opposite directions are connected to each other with an easy-to-implement simple circuit configuration.

In addition, a high-frequency module according to embodiments of the present disclosure may have a configuration below. The high-frequency module includes a first diplexer including the high-frequency filter described above and a first lowpass filter, a first antenna terminal, a first directional coupler, a first-frequency-band high-frequency filter, a second-frequency-band high-frequency filter, a second lowpass filter, and an integrated module including one or a plurality of semiconductor elements and having functions of a switch circuit, a low-noise amplifier, and a power amplifier.

The first directional coupler is connected to the first antenna terminal. The first diplexer is connected to the first directional coupler. The first-frequency-band high-frequency filter is connected to the first lowpass filter. The second lowpass filter is connected to the first-frequency-band high-frequency filter. The integrated module is connected to the high-frequency filter. The second-frequency-band high-frequency filter is connected to the integrated module.

With this configuration, the use of the high-frequency filter according to embodiments of the present disclosure in a high-frequency module improves transmission/reception characteristics of the high-frequency module.

In addition, a high-frequency module according to embodiments of the present disclosure may have a configuration below. The high-frequency module includes a second antenna terminal, a third antenna terminal, a second directional coupler, a first-frequency-band high-frequency filter, a third-frequency-band high-frequency filter that is the high-frequency filter described above, a fourth-frequency-band high-frequency filter, a third lowpass filter, and an integrated module including one or a plurality of semiconductor elements and having functions of a switch circuit, a low-noise amplifier, and a power amplifier.

The second directional coupler is connected to the second antenna terminal and the third antenna terminal. The first-frequency-band high-frequency filter and the third-frequency-band high-frequency filter are connected to the second directional coupler. The third lowpass filter is connected to the first-frequency-band high-frequency filter. The integrated module is connected to the third-frequency-band high-frequency filter. The fourth-frequency-band high-frequency filter is connected to the integrated module.

Also with this configuration, the use of the high-frequency filter according to embodiments of the present disclosure in a high-frequency module improves transmission/reception characteristics of the high-frequency module.

In addition, the high-frequency module according to embodiments of the present disclosure may have a configuration below. The first-frequency-band high-frequency filter is a bulk acoustic wave (BAW) filter.

With this configuration, highly steep filter characteristics can be obtained.

In addition, the high-frequency module according to embodiments of the present disclosure may have a configuration below. The first-frequency-band high-frequency filter is a surface acoustic wave (SAW) filter including a multilayer substrate having piezoelectricity at least partially.

With this configuration, highly steep filter characteristics can be obtained.

According to the embodiments of the present disclosure, a deterioration of filter characteristics is successfully suppressed with a simple configuration.

Other features, elements, and characteristics of the present disclosure will become more apparent from the following detailed description of embodiments of the present disclosure with reference to the attached drawings.

DETAILED DESCRIPTION

Figure 1:
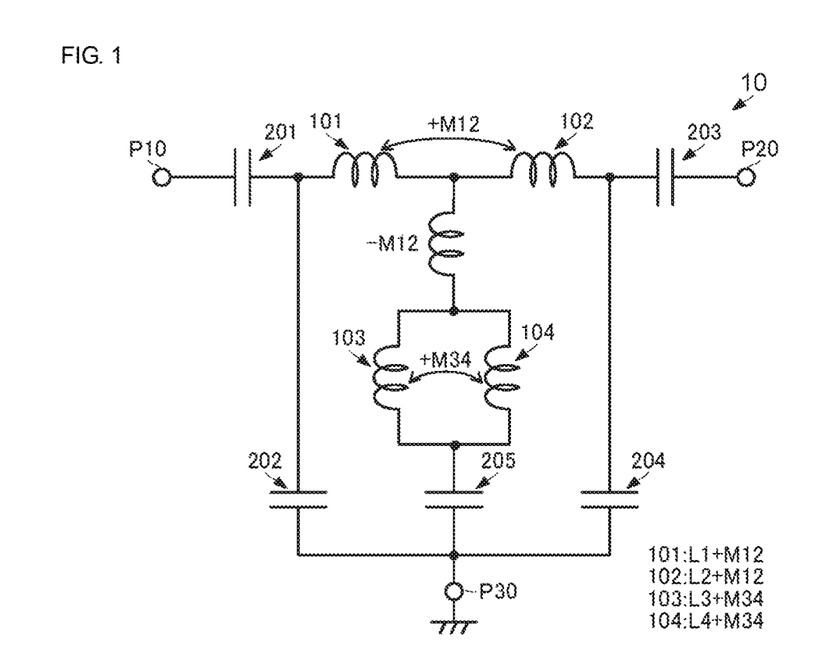
FIG. 1 is a circuit diagram of a high-frequency filter according to an embodiment of the present disclosure.

A high-frequency filter according to an embodiment of the present disclosure will be described with reference to the accompanying drawings. FIG. 1 is a circuit diagram of the high-frequency filter according to the embodiment of the present disclosure.

As illustrated in FIG. 1, a high-frequency filter 10 includes terminals P10, P20, and P30; inductors 101, 102, 103, and 104; and capacitors 201, 202, 203, 204, and 205. The terminal P10 corresponds to a "first terminal" according to an aspect of the present disclosure. The terminal P20 corresponds to a "second terminal" according to an aspect of the present disclosure. The terminal P30 corresponds to a "third terminal" according to an aspect of the present disclosure. The inductor 101 corresponds to a "first inductor" according to an aspect of the present disclosure. The inductor 102 corresponds to a "second inductor" according to an aspect of the present disclosure. The inductor 103 corresponds to a "third inductor" according to an aspect of the present disclosure. The inductor 104 corresponds to a "fourth inductor" according to an aspect of the present disclosure. The capacitor 201 corresponds to a "first capacitor" according to an aspect of the present disclosure. The capacitor 202 corresponds to a "third capacitor" according to an aspect of the present disclosure. The capacitor 203 corresponds to a "second capacitor" according to an aspect of the present disclosure. The capacitor 204 corresponds to a "fourth capacitor" according to an aspect of the present disclosure. The capacitor 205 corresponds to a "fifth capacitor" according to an aspect of the present disclosure.

The terminals P10 and P20 are input/output terminals of a high-frequency signal in the high-frequency filter 10. The terminal P30 is connected to ground (is grounded).

The inductor 101 and the inductor 102 are connected in series to each other. This series circuit is connected between the terminal P10 and the terminal P20. That is, the inductor 101 and the inductor 102 are so-called series inductors of the high-frequency filter 10, and the circuit to which the terminal P10 and the terminal P20 are connected is a series circuit of the high-frequency filter 10.

The capacitor 201 is connected between the terminal P10 and the inductor 101. The capacitor 203 is connected between the terminal P20 and the inductor 102.

The inductor 103 and the inductor 104 are connected in parallel to each other. This parallel circuit is connected between the terminal P30 and a node of the inductor 101 and the inductor 102. That is, the inductor 103 and the inductor 104 are shunt inductors of the high-frequency filter 10, and the circuit to which the terminal P30 and the node of the inductor 101 and the inductor 102 are connected is a shunt circuit of the high-frequency filter 10.

The capacitor 202 is connected between the terminal P30 and a node of the capacitor 201 and the inductor 101. The capacitor 204 is connected between the terminal P30 and a node of the capacitor 203 and the inductor 102. The capacitor 205 is connected between the terminal P30 and the parallel circuit of the inductor 103 and the inductor 104.

The connection between the inductor 101 and the inductor 102 is an additive polarity connection. The connection between the inductor 103 and the inductor 104 is an additive polarity connection. An additive polarity connection refers to a configuration in which two inductors are arranged to cause mutual induction and these two inductors are connected to have a positive mutual inductance.

With such a configuration, the inductor 101 has an inductance (L1+M12) that is greater, by a mutual inductance M12, than an inductance L1 that the inductor 101 structurally has. Likewise, the inductor 102 has an inductance (L2+M12) that is greater, by the mutual inductance M12, than an inductance L2 that the inductor 102 structurally has.

As a result, the inductances of the inductor 101 and the inductor 102 increase with resistances of the inductor 101 and the inductor 102 kept unchanged. Thus, the Q factors of the inductors 101 and 102 increase. In other words, the Q factor of the series circuit including the inductor 101 and the inductor 102 increases.

In the case where the inductor 101 and the inductor 102, which are series inductors, have a positive inductance (+M12) owing to mutual induction as described above, a negative inductance (−M12) is produced between the terminal P30 and the node of the inductor 101 and the inductor 102 (in the shunt circuit).

As described above, the shunt circuit of the high-frequency filter 10 is constituted by a parallel circuit of two inductors (i.e., the inductor 103 and the inductor 104) instead of a single inductor. The connection between the inductor 103 and the inductor 104 is an additive polarity connection.

With such a configuration, the inductor 103 has an inductance (L3+M34) that is greater, by a mutual inductance M34, than an inductance L3 that the inductor 103 structurally has. Likewise, the inductor 104 has an inductance (L4+L34) that is greater, by the mutual inductance M34, than an inductance L4 that the inductor 104 structurally has.

As a result, a positive parallel inductance $(+(M34)^2/(2\times M34))$ of two positive inductances (+M34) is added to the inductance of the shunt circuit. The positive parallel inductance $(+(M34)^2/(2\times M34))$ reduces a decrease in the inductance of the shunt circuit caused by the negative inductance (−M12). Consequently, a decrease in the Q factor of the shunt circuit is reduced.

With the circuit configuration described above, the Q factor of the series circuit increases and a decrease in the Q factor of the shunt circuit is reduced in the high-frequency filter 10. As a result, the high-frequency filter 10 is able to suppress a deterioration of filter characteristics with a simple circuit configuration and have good filter characteristics.

Figure 2:
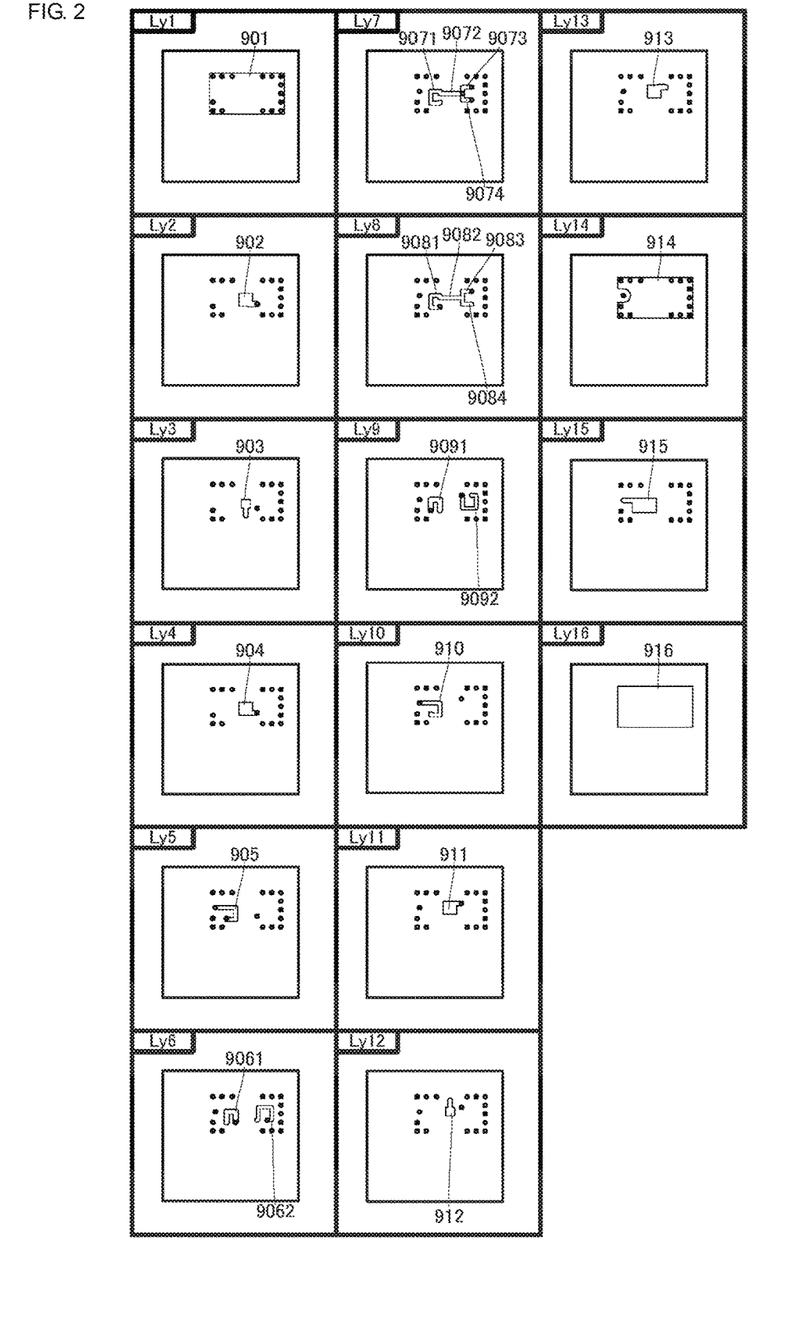
FIG. 2 is a diagram illustrating layers of the high-frequency filter according to the embodiment of the present disclosure that are to be stacked.

The high-frequency filter 10 having such a configuration can be implemented by a structure described below. FIG. 2 is a diagram illustrating layers of the high-frequency filter according to the embodiment of the present disclosure that are to be stacked. FIG. 2 omits an illustration of layers having the external connection terminals. Each circle illustrated in FIG. 2 represents an interlayer connection conductor that lies from the front surface to the back surface of a dielectric layer.

The high-frequency filter 10 is constituted by a multilayer body. The multilayer body has a substantially rectangular parallelepiped shape having a first principal surface and a second principal surface that are parallel to each other. The multilayer body is obtained by stacking a plurality of dielectric layers including dielectric layers Ly1 to Ly16 illustrated in FIG. 2 one on top of the other. As illustrated in FIG. 2, conductor patterns and interlayer connection conductors are disposed on and in the dielectric layers Ly1 to Ly16. The dielectric layers Ly1 to Ly16 are stacked in this order from the first-principal-surface side to the second-principal-surface side of the multilayer body.

A conductor pattern 901 having a rectangular or substantially rectangular shape is disposed on the dielectric layer Ly1. In plan view of the multilayer body (in a direction perpendicular to the first principal surface and the second principal surface), the conductor pattern 901 is shaped to include a region where conductor patterns of the inductors and capacitors (described later) are disposed. The conductor pattern 901 is a conductor pattern for a reference potential and serves as a ground conductor. The conductor pattern 901 corresponds to a "sixth planar conductor" according to an aspect of the present disclosure.

A conductor pattern 902 is disposed on the dielectric layer Ly2. The conductor pattern 902 has a rectangular or substantially rectangular shape. In plan view of the multilayer body, the conductor pattern 902 and the conductor pattern 901 overlap. In other words, the conductor pattern 902 and the conductor pattern 901 oppose each other with the dielectric layer Ly1 interposed therebetween. With such a configuration, the capacitor 202 is formed. The conductor pattern 902 corresponds to a "fifth planer conductor" according to an aspect of the present disclosure.

A conductor pattern 903 is disposed on the dielectric layer Ly3. The conductor pattern 903 has a rectangular or substantially rectangular shape and is connected to the terminal P10 (not illustrated). In plan view of the multilayer body, the conductor pattern 903 and the conductor pattern 902 overlap. In other words, the conductor pattern 903 and the conductor pattern 902 oppose each other with the dielectric layer Ly2 interposed therebetween. The conductor pattern 903 corresponds to a "first planar conductor" according to an aspect of the present disclosure.

A conductor pattern 904 is disposed on the dielectric layer Ly4. The conductor pattern 904 has a rectangular or substantially rectangular shape. In plan view of the multilayer body, the conductor pattern 904 and the conductor pattern 903 overlap. In other words, the conductor pattern 904 and the conductor pattern 903 oppose each other with the dielectric layer Ly3 interposed therebetween. The conductor pattern 904 is connected to the conductor pattern 902 by interlayer connection conductors. As described above, the conductor pattern 902 and the conductor pattern 903 oppose each other with the dielectric layer Ly2 interposed therebetween, the conductor pattern 903 and the conductor pattern 904 oppose each other with the dielectric layer Ly3 interposed therebetween, and the conductor pattern 904 and the conductor pattern 902 are connected to each other. In this way, the capacitor 201 is formed. The conductor pattern 904 corresponds to a "second planer conductor" according to an aspect of the present disclosure.

A conductor pattern 905 is disposed on the dielectric layer Ly5. The conductor pattern 905 is shaped in a line having a winding shape. The term "winding shape" used herein refers to a shape including at least one bent or curve somewhere in an extending direction. In plan view of the multilayer body, the conductor pattern 905 is disposed at a position that is different from (does not coincide with) positions of the conductor patterns 902, 903, and 904.

Conductor patterns 9061 and 9062 are disposed on the dielectric layer Ly6. Each of the conductor patterns 9061 and 9062 is shaped in a line having a winding shape. In plan view of the multilayer body, the conductor pattern 9061 is disposed at a position that is different from (does not coincide with) the positions of the conductor patterns 902, 903, and 904. In plan view of the multilayer body, the conductor pattern 9062 is disposed at a position that is different from (does not coincide with) the positions of the conductor patterns 902, 903, and 904. In plan view of the multilayer body, the conductor pattern 9061 and the conductor pattern 9062 are disposed such that the conductor patterns 902, 903, and 904 are interposed therebetween.

In plan view of the multilayer body, an opening at the center or substantially at the center of the winding shape of the conductor pattern 9061 and an opening at the center or substantially at the center of the winding shape of the conductor pattern 905 overlap.

Conductor patterns 9071, 9072, 9073, and 9074 are disposed on the dielectric layer Ly7. Each of the conductor patterns 9071, 9073, and 9074 is shaped in a line having a winding shape. The conductor pattern 9072 is shaped in a straight line.

In plan view of the multilayer body, the conductor pattern 9071 is disposed at a position that is different from (does not coincide with) the positions of the conductor patterns 902, 903, and 904. In plan view of the multilayer body, the conductor pattern 9073 is disposed at a position that is different from (does not coincide with) the positions of the conductor patterns 902, 903, and 904. In plan view of the multilayer body, the conductor pattern 9074 is disposed at a position that is different from (does not coincide with) the positions of the conductor patterns 902, 903, and 904. In plan view of the multilayer body, the conductor pattern 9071 and the conductor patterns 9073 and 9074 are disposed such that the conductor patterns 902, 903, and 904 are interposed therebetween.

In plan view of the multilayer body, an opening at the center or substantially at the center of the winding shape of the conductor pattern 9071 and the opening at the center or substantially at the center of the winding shape of the conductor pattern 9061 overlap.

The conductor pattern 9073 and the conductor pattern 9074 are joined together to be continuous. The joined conductor patterns 9073 and 9074 also have a winding shape. In plan view of the multilayer body, an opening at the center or substantially at the center of the winding shape of the conductor patterns 9073 and 9074 and the opening at the center or substantially at the center of the winding shape of the conductor pattern 9062 overlap.

The conductor pattern 9072 connects to each other a node of the conductor patterns 9073 and 9074 and one end of the conductor pattern 9071 in the extending direction. In plan view of the multilayer body, the conductor pattern 9072 is located to have overlaps with the conductor patterns 902, 903, and 904.

Conductor patterns 9081, 9082, 9083, and 9084 are disposed on the dielectric layer Ly8. Each of the conductor patterns 9081, 9083, and 9084 is shaped in a line having a winding shape. The conductor pattern 9082 is shaped in a straight line.

In plan view of the multilayer body, the conductor pattern 9081 is disposed at a position that is different from (does not coincide with) the positions of the conductor patterns 902, 903, and 904. In plan view of the multilayer body, the conductor pattern 9083 is disposed at a position that is different from (does not coincide with) the positions of the conductor patterns 902, 903, and 904. The conductor pattern 9084 is disposed at a position that is different from (does not coincide with) the positions of the conductor patterns 902, 903, and 904. In plan view of the multilayer body, the conductor pattern 9081 and the conductor patterns 9083 and 9084 are disposed such that the conductor patterns 902, 903, and 904 are interposed therebetween.

In plan view of the multilayer body, the conductor pattern 9081 and the conductor pattern 9071 overlap substantially entirely. An opening at the center or substantially at the center of the winding shape of the conductor pattern 9081 and the opening at the center or substantially at the center of the winding shape of the conductor pattern 9071 overlap.

The conductor patterns 9083 and 9084 are joined to be continuous. The joined conductor patterns 9083 and 9084 also have a winding shape.

In plan view of the multilayer body, the conductor pattern 9083 and the conductor pattern 9073 overlap substantially entirely. Ends of the conductor pattern 9083 in the extending direction are connected to respective ends of the conductor pattern 9073 by interlayer connection conductors. The conductor pattern 9084 and the conductor pattern 9074 overlap substantially entirely. Ends of the conductor pattern 9084 are connected to respective ends of the conductor pattern 9074 by interlayer connection conductors. An opening at the center or substantially at the center of the winding shape of the conductor patterns 9083 and 9084 and the opening at the center or substantially at the center of the winding shape of the conductor patterns 9073 and 9074 overlap.

The conductor pattern 9082 connects to each other a node of the conductor patterns 9083 and 9084 and one end of the conductor pattern 9081 in the extending direction. In plan view of the multilayer body, the conductor pattern 9082 and the conductor pattern 9072 overlap substantially entirely, and the conductor pattern 9082 is located to have overlaps with the conductor patterns 902, 903, and 904.

Conductor patterns 9091 and 9092 are disposed on the dielectric layer Ly9. Each of the conductor patterns 9091 and 9092 is shaped in a line having a winding shape. In plan view of the multilayer body, the conductor pattern 9091 is disposed at a position that is different from (does not coincide with) the positions of the conductor patterns 902, 903, and 904. In plan view of the multilayer body, the conductor pattern 9092 is disposed at a position that is different from (does not coincide with) the positions of the conductor patterns 902, 903, and 904. In plan view of the multilayer body, the conductor pattern 9091 and the conductor pattern 9092 are disposed such that the conductor patterns 902, 903, and 904 are interposed therebetween.

In plan view of the multilayer body, an opening at the center or substantially at the center of the winding shape of the conductor pattern 9091 and the opening at the center or substantially at the center of the winding shape of the conductor pattern 9081 overlap. In plan view of the multilayer body, an opening at the center or substantially at the center of the winding shape of the conductor pattern 9092 and the opening at the center or substantially at the center of the winding shape of the conductor patterns 9083 and 9084 overlap.

A conductor pattern 910 is disposed on the dielectric layer Ly10. The conductor pattern 910 is shaped in a line having a winding shape. In plan view of the multilayer body, the conductor pattern 910 is disposed at a position that is different from (does not coincide with) the positions of the conductor patterns 902, 903, and 904. In plan view of the multilayer body, an opening at the center or substantially at the center of the winding shape of the conductor pattern 910 and the opening at the center or substantially at the center of the winding shape of the conductor pattern 9091 overlap.

The dielectric layers Ly5 to Ly10 have the configuration described above. In this way, the inductors 101, 102, 103, and 104 are formed.

Specifically, the inductor 101 is constituted by the conductor pattern 9062, the conductor patterns 9073 and 9083, and the interlayer connection conductors that connect these conductor patterns. The inductor 101 has a winding axis that is parallel to the stacking direction of the plurality of dielectric layers. The inductor 102 is constituted by the conductor pattern 9092, the conductor patterns 9084 and 9074, and interlayer connection conductors that connect these conductor patterns. The inductor 102 has a winding axis that is parallel to the stacking direction of the plurality of dielectric layers. In plan view of the multilayer body, the wiring axis of the inductor 101 and the winding axis of the inductor 102 are substantially at the same position.

The inductor 103 is constituted by the conductor patterns 905, 9061, and 9071 and interlayer connection conductors that connect these conductor patterns. The inductor 103 has a winding axis that is parallel to the stacking direction of the plurality of dielectric layers. The inductor 104 is constituted by the conductor patterns 910, 9091, and 9081 and interlayer connection conductors that connect these conductor patterns. The inductor 104 has a winding axis that is parallel to the stacking direction of the plurality of dielectric layers. In plan view of the multilayer body, the wiring axis of the inductor 103 and the winding axis of the inductor 104 are substantially at the same position.

A conductor pattern 911 is disposed on the dielectric layer Ly11. The conductor pattern 911 has a rectangular or substantially rectangular shape. In plan view of the multilayer body, the conductor pattern 911 is disposed substantially at the same position as the positions of the conductor patterns 902, 903, and 904. In other words, in plan view of the multilayer body, the conductor pattern 911 is disposed between a region where the inductors 101 and 102 are disposed and a region where the inductors 103 and 104 are disposed. The conductor pattern 911 corresponds to a "fourth planar conductor" according to an aspect of the present disclosure.

A conductor pattern 912 is disposed on the dielectric layer Ly12. The conductor pattern 912 has a rectangular or substantially rectangular shape and is connected to the terminal P20 (not illustrated). In plan view of the multilayer body, the conductor pattern 912 and the conductor pattern 911 overlap. In other words, the conductor pattern 912 is disposed substantially at the same position as the positions of the conductor patterns 902, 903, and 904. The conductor pattern 912 and the conductor pattern 911 oppose each other with the dielectric layer Ly11 interposed therebetween. The conductor pattern 912 corresponds to a "third planar conductor" according to an aspect of the present disclosure.

A conductor pattern 913 is disposed on the dielectric layer Ly13. The conductor pattern 913 has a rectangular or substantially rectangular shape. In plan view of the multilayer body, the conductor pattern 913 and the conductor pattern 912 overlap. In other words, the conductor pattern 913 is disposed substantially at the same position as the positions of the conductor patterns 902, 903, and 904. The conductor pattern 913 and the conductor pattern 912 oppose each other with the dielectric layer Ly12 interposed therebetween. The conductor pattern 913 is connected to the conductor pattern 911 by interlayer connection conductors. As described above, the conductor pattern 911 and the conductor pattern 912 oppose each other with the dielectric layer Ly11 interposed therebetween, the conductor pattern 912 and the conductor pattern 913 oppose each other with the dielectric layer Ly12 interposed therebetween, and the conductor pattern 911 and the conductor pattern 913 are connected to each other. In this way, the capacitor 203 is formed. The conductor pattern 913 corresponds to a "seventh planar conductor" according to an aspect of the present disclosure.

A conductor pattern 914 having a rectangular or substantially rectangular shape is disposed on the dielectric layer Ly14. In plan view of the multilayer body, the conductor pattern 914 is shaped to include the region where the conductor patterns of the inductors and capacitors described above are disposed. The conductor pattern 914 is a conductor pattern for a reference potential and serves as a ground conductor. The conductor pattern 913 and the conductor pattern 914 oppose each other with the dielectric layer Ly13 interposed therebetween. With such a configuration, the capacitor 204 is formed. The conductor pattern 914 corresponds to an "eighth planar conductor" according to an aspect of the present disclosure.

A conductor pattern 915 is disposed on the dielectric layer Ly15. The conductor pattern 915 has a rectangular or substantially rectangular shape. In plan view of the multilayer body, the conductor pattern 915 and the conductor pattern 914 overlap. In other words, the conductor pattern 915 and the conductor pattern 914 oppose each other with the dielectric layer Ly14 interposed therebetween. The conductor pattern 915 corresponds to a "ninth planar conductor" according to an aspect of the present disclosure.

A conductor pattern 916 having a rectangular or substantially rectangular shape is disposed on the dielectric layer Ly16. In plan view of the multilayer body, the conductor pattern 916 is shaped to include the region where the conductor patterns of the inductors and capacitors described above are disposed. In plan view of the multilayer body, the conductor pattern 916 and the conductor pattern 914 overlap substantially entirely. The conductor pattern 916 is a conductor pattern for a reference potential and serves as a ground conductor. The conductor pattern 915 and the conductor pattern 916 oppose each other with the dielectric layer Ly15 interposed therebetween. The conductor pattern 916 is connected to the conductor pattern 914 by interlayer connection conductors.

As described above, the conductor pattern 914 and the conductor pattern 915 oppose each other with the dielectric layer Ly14 interposed therebetween, the conductor pattern 915 and the conductor pattern 916 oppose each other with the dielectric layer Ly15 interposed therebetween, and the conductor pattern 914 and the conductor pattern 916 are connected to each other. In this way, the capacitor 205 is formed. The conductor pattern 916 corresponds to a "tenth planar conductor" according to an aspect of the present disclosure.

The conductor pattern 901 on the dielectric layer Ly1, the conductor pattern 914 on the dielectric layer Ly14, and the conductor pattern 916 on the dielectric layer Ly16 are connected to the terminal P30 (not illustrated).

Figure 3:
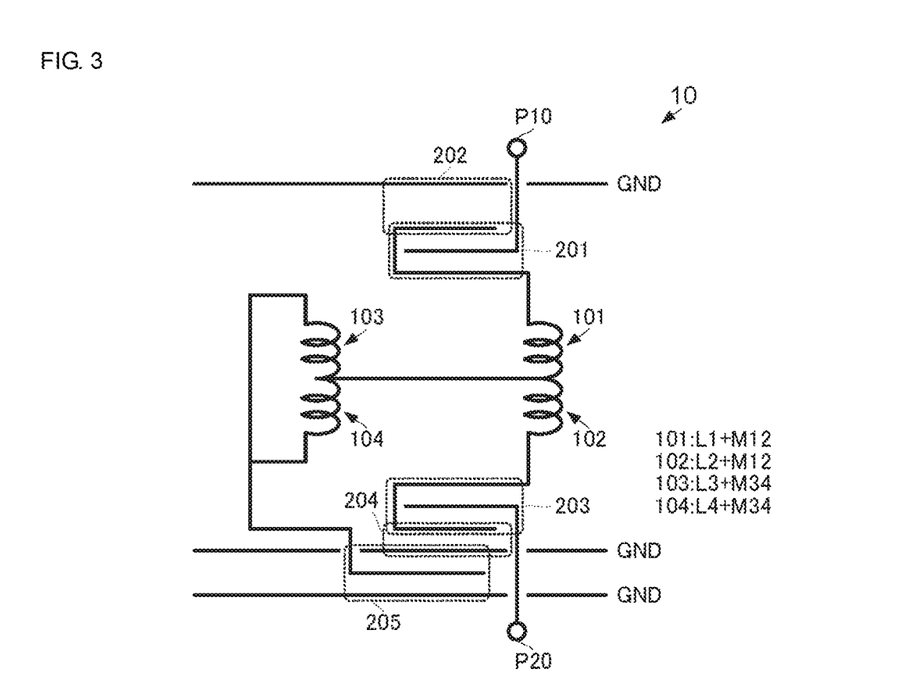
FIG. 3 is a lateral view of a schematic configuration of the high-frequency filter according to the embodiment of the present disclosure.
Figure 4:
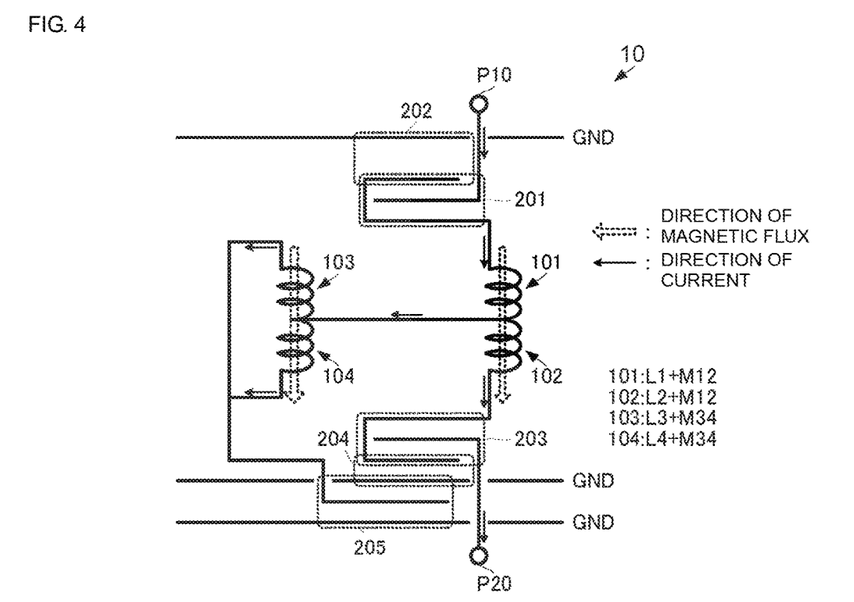
FIG. 4 is a diagram illustrating directions of magnetic fluxes and directions of currents in the high-frequency filter according to the embodiment of the present disclosure.

FIG. 3 is a lateral view of a schematic configuration of the high-frequency filter according to the embodiment of the present disclosure. FIG. 4 is a diagram illustrating directions of magnetic fluxes and directions of currents in the high-frequency filter according to the embodiment of the present disclosure.

With the structure illustrated in FIG. 2, the high-frequency filter 10 includes the ground conductors on the first principal surface or a layer near the first principal surface and on the second principal surface or a layer near the second principal surface as illustrated in FIGS. 3 and 4. The high-frequency filter 10 includes, in the multilayer body, the inductors 101, 102, 103, and 104 each having a helical shape and winding around an axis that is parallel to the stacking direction. In plan view of the multilayer body, the winding axis of the inductor 101 and the winding axis of the inductor 102 are substantially at the same position, and the winding axis of the inductor 103 and the winding axis of the inductor 104 are substantially at the same position.

The conductor pattern 9061 that constitutes the inductor 103 and the conductor pattern 9062 that constitutes the inductor 101 are disposed on the surface of the dielectric layer Ly6. Likewise, the conductor pattern 9071 that constitutes the inductor 103 and the conductor pattern 9073 that constitutes the inductor 101 are disposed on the surface of the dielectric layer Ly7. Thus, the inductor 101 and the inductor 103 partially overlap in lateral view of the multilayer body.

In addition, the conductor pattern 9081 that constitutes the inductor 104 and the conductor pattern 9084 that constitutes the inductor 102 are disposed on the surface of the dielectric layer Ly8. Likewise, the conductor pattern 9091 that constitutes the inductor 104 and the conductor pattern 9092 that constitutes the inductor 102 are disposed on the surface of the dielectric layer Ly9. Thus, the inductor 102 and the inductor 104 partially overlap in lateral view of the multilayer body.

The node of the inductor 101 and the inductor 102 is connected to the node of the inductor 103 and the inductor 104.

Further, the direction of the magnetic flux produced by the inductor 101 is identical to the direction of the magnetic flux produced by the inductor 102. The direction of the magnetic flux produced by the inductor 103 is identical to the direction of the magnetic flux produced by the inductor 104.

In this way, additive polarity connections are implemented between the inductor 101 and the inductor 102 and between the inductor 103 and the inductor 104.

In addition, the capacitors 201 and 202 are disposed between the ground conductor on the first-principal-surface side and a region where the inductors 101, 102, 103, and 104 are disposed in the stacking direction. The capacitors 203, 204, and 205 are disposed between the ground conductor on the second-principal-surface side and the region where the inductors 101, 102, 103, and 104 are disposed. With such a configuration, a length of a conductor-pattern-free region surrounded by the ground conductors and the inductors 101, 102, 103, and 104 is successfully increased. As a result, a situation where the magnetic fluxes produced by the inductors 101, 102, 103, and 104 are blocked by the ground conductors is successfully avoided, and characteristics of the inductors 101, 102, 103, and 104 improve.

In addition, the capacitors 201, 202, 203, 204, and 205 are disposed between the region where the inductors 101 and 102 are disposed and the region where the inductors 103 and 104 are disposed in a direction perpendicular to the stacking direction. With such a configuration, the dimension of the multilayer body in the direction perpendicular to the stacking direction is successfully reduced. That is, the high-frequency filter 10 is successfully made compact.

The conductor pattern 915 that constitutes the capacitor 205 is interposed between the conductor patterns 914 and 916 that serve as ground conductors in the stacking direction. With such a configuration, coupling of the conductor pattern 915 to another conductor pattern is successfully suppressed, and filter characteristics of the high-frequency filter 10 are successfully improved.

In addition, the inductors 101 and 102 are connected to the inductor 103 by the conductor pattern 9072 on the dielectric layer Ly7. The inductors 101 and 102 are connected to the inductor 104 by the conductor pattern 9082 on the dielectric layer Ly8. In this way, additive polarity connections are successfully implemented between the inductor 101 and 102 and between the inductor 103 and the inductor 104 with a simple configuration. In addition, a resistance of the connection between the inductors 101 and 102 and the inductors 103 and 104 is successfully made small, and the Q factor of the shunt circuit is successfully improved further.

In addition, the capacitance of the capacitor 201 is successfully increased by interposing the conductor pattern 903 connected to the terminal P10 between the conductor patterns 902 and 904. Likewise, the capacitance of the capacitor 203 is also successfully increased by interposing the conductor pattern 912 connected to the terminal P20 between the conductor patterns 911 and 913.

In addition, the capacitors 201 and 202 and the capacitors 203 and 204 are disposed with the inductors 101, 102, 103, and 104 interposed therebetween in the stacking direction. With such a configuration, unwanted coupling between the capacitors 201 and 202 and the capacitors 203 and 204 is suppressed, and desired filter characteristics are successfully implemented.

In addition, as illustrated in FIG. 2, in plan view of the multilayer body, the region where the conductor patterns of the inductors and capacitors are disposed is located on an inner side of outlines of the conductor patterns 901, 914, and 916 serving as ground conductors. The conductor patterns 901, 914, and 916 are connected to one another by a plurality of interlayer connection conductors along this outlines. With such a configuration, electromagnetic coupling between an external environment and the inductors and capacitors of the high-frequency filter 10 is successfully suppressed, and filter characteristics of the high-frequency filter 10 are successfully improved.

Figure 5:
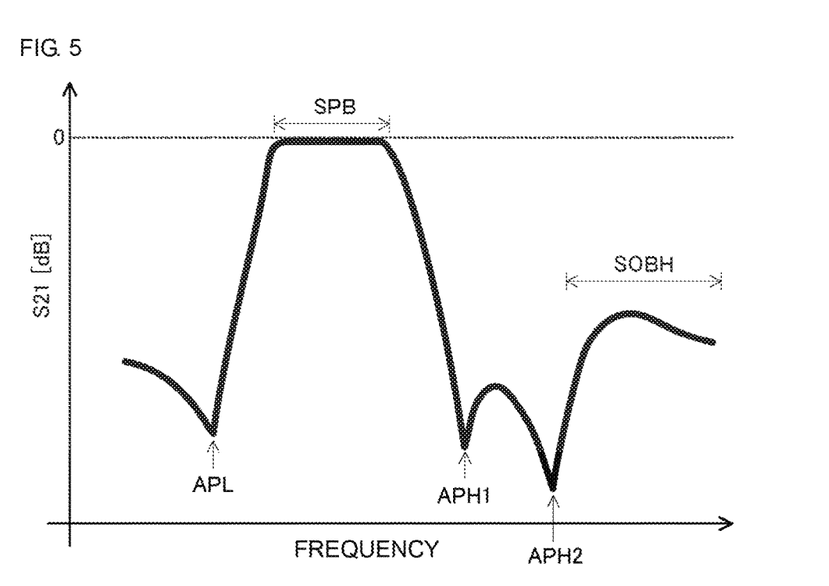
FIG. 5 is a graph illustrating filter characteristics of the high-frequency filter according to the embodiment of the present disclosure.

With the structure described above, the high-frequency filter 10 is able to implement filter characteristics illustrated in FIG. 5. FIG. 5 is a graph illustrating the filter characteristics of the high-frequency filter according to the embodiment of the present disclosure.

With the circuit configuration described above, the Q factors of the series circuit and the shunt circuit of the high-frequency filter 10 increase. Thus, the high-frequency filter 10 is able to implement filter characteristics in which a loss is small in a passband SPB as illustrated in FIG. 5. Further, the high-frequency filter 10 is able to make attenuation steep at an attenuation pole APL on the lower-frequency side of the passband SPB and at attenuation poles APH1 and APH2 on the higher-frequency side of the passband SPB. In addition, the high-frequency filter 10 is able to increase attenuation in a rebound region SOBH of the attenuation band on the higher-frequency side of the passband SPB.

Accordingly, with the configuration described above, the high-frequency filter 10 is able to implement filter characteristics including good bandpass characteristics and good attenuation characteristics. In addition, the high-frequency filter 10 is able to implement such good filter characteristics with a simple configuration.

Although the configuration of the high-frequency filter 10 including a plurality of inductors and a plurality of capacitors has been described above, the plurality of capacitors may be omitted.

Figure 6A:
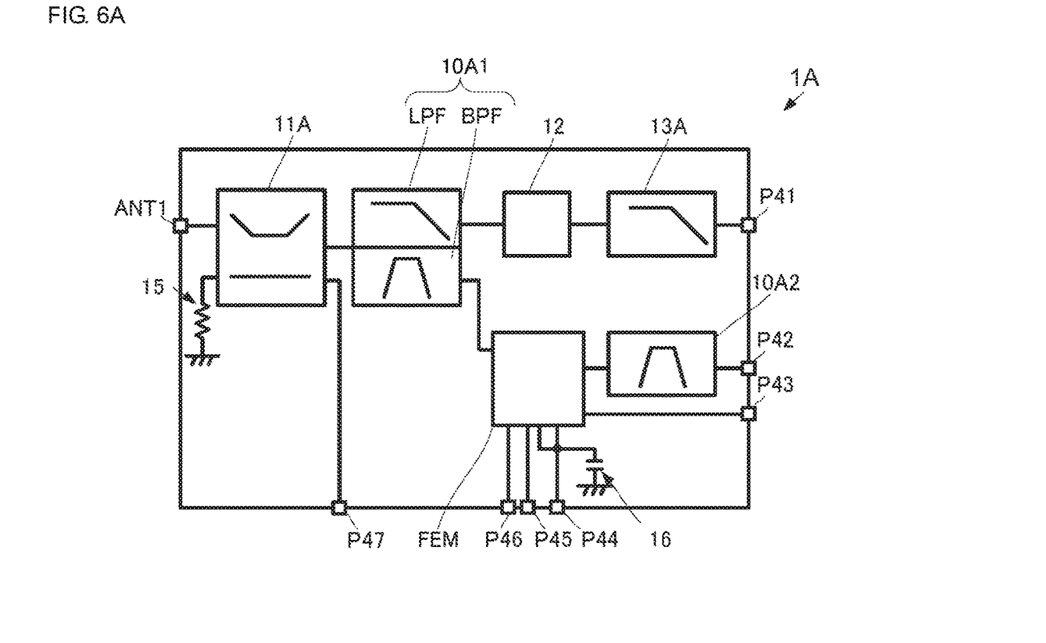
FIG. 6A is a functional block diagram of a high-frequency module (of a single-antenna-terminal type) including a high-frequency frontend circuit according to an embodiment of the present disclosure.
Figure 6B:
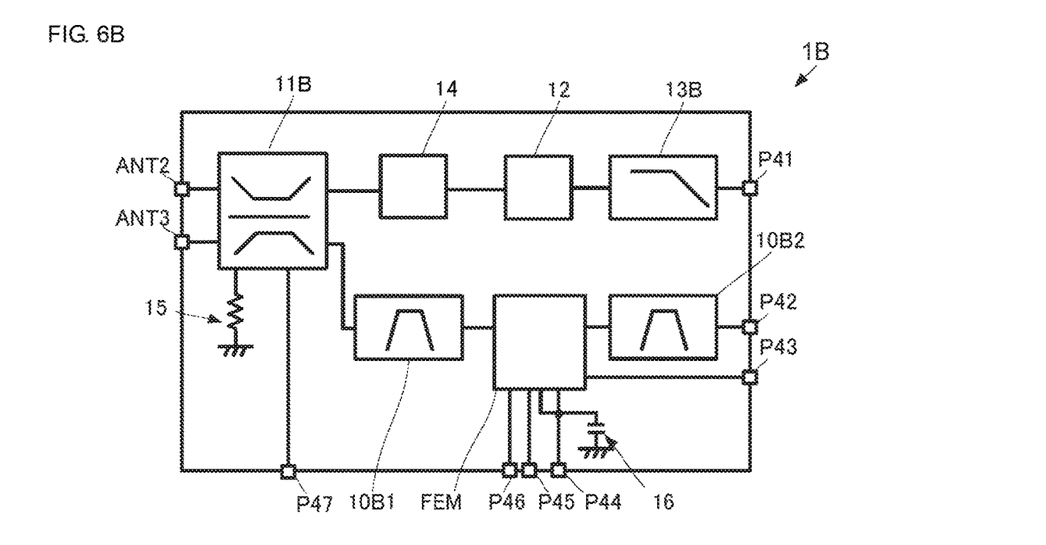
FIG. 6B is a functional block diagram of a high-frequency module (of a dual-antenna-terminal type) including a high-frequency frontend circuit according to an embodiment of the present disclosure.

FIG. 6A is a functional block diagram of a high-frequency module (of a single-antenna-terminal type) including a high-frequency frontend circuit according to an embodiment of the present disclosure. FIG. 6B is a functional block diagram of a high-frequency module (of a dual-antenna-terminal type) including a high-frequency frontend circuit according to an embodiment of the present disclosure.

As illustrated in FIG. 6A, a high-frequency module 1A includes a directional coupler 11A, a demultiplexing circuit 10A1, a high-frequency filter 12, a lowpass filter 13A, an integrated module FEM, a high-frequency filter 10A2, an antenna terminal ANT1, terminals P41, P42, P43, P44, P45, P46, and P47, a resistor 15, and a capacitor 16. The directional coupler 11A corresponds to a "first directional coupler" according to an aspect of the present disclosure. The antenna terminal ANT1 corresponds to a "first antenna terminal" according to an aspect of the present disclosure. The high-frequency filter 12 corresponds to a "first-frequency-band high-frequency filter" according to an aspect of the disclosure.

The demultiplexing circuit 10A1 includes a diplexer that separates a 2.4-GHz frequency band and a 5-GHz frequency band. The diplexer includes a lowpass filter LPF for the 2.4-GHz band and a bandpass filter BPF for the 5-GHz band. The lowpass filter LPF for the 2.4-GHz band corresponds to a "first lowpass filter" according to an aspect of the present disclosure. The bandpass filter BPF for the 5-GHz band corresponds to a "high-frequency filter" according to an aspect of the present disclosure.

The demultiplexing circuit 10A1 may further include a high-frequency matching circuit desirably. Note that a bandpass filter having the above-described configuration other than the bandpass filter BPF of the diplexer may be connected. The demultiplexing circuit 10A1 corresponds to a "first diplexer" according to an aspect of the present disclosure including the "first lowpass filter" according to an aspect of the disclosure.

The high-frequency filter 12 is a bandpass filter for the 2.4-GHz band and is implemented by, for example, an elastic wave filter.

The lowpass filter 13A is a lowpass filter for the 2.4 GHz band. The lowpass filter 13A may further include a high-frequency matching circuit desirably. The lowpass filter 13A corresponds to a "second lowpass filter" according to an aspect of the present disclosure.

The integrated module FEM is constituted by one or a plurality of semiconductor elements. The integrated module FEM has functions of a switch circuit, a power amplifier, and a low-noise amplifier, for example.

The high-frequency filter 10A2 is a bandpass filter for the 5-GHz band. The high-frequency filter 10A2 corresponds to a "second-frequency-band high-frequency filter" according to an aspect of the present disclosure. The high-frequency filter 10A2 can be implemented by the same configuration as that of the bandpass filter of the demultiplexing circuit 10A1.

The terminal P41 is a terminal for transmission/reception of the 2.4-GHz band. The terminal P42 is a transmission terminal for the 5-GHz band, and the terminal P43 is a reception terminal for the 5-GHz band.

The antenna terminal ANT1 is connected to the directional coupler 11A. The directional coupler 11A is connected to the demultiplexing circuit 10A1 and the terminal P47. The directional coupler 11A is also connected to the resistor 15. With this configuration, a detection circuit (monitor circuit) of a high-frequency signal that is input from and output to the antenna terminal ANT1 is implemented.

The demultiplexing circuit 10A1 is connected to the high-frequency filter 12 and the integrated module FEM. The high-frequency filter 12 is connected to the lowpass filter 13A. The lowpass filter 13A is connected to the terminal P41.

The integrated module FEM is connected to the bandpass filter of the demultiplexing circuit 10A1, the high-frequency filter 10A2, the terminals P43, P44, P45, and P46, and the capacitor 16. The high-frequency filter 10A2 is connected to the terminal P42.

Transmission of a high-frequency signal of the 2.4-GHz band will be described.

A high-frequency signal is input to the lowpass filter 13A from the terminal P41. The lowpass filter 13A attenuates harmonics of the high-frequency signal input thereto from the terminal P41.

Noise in the high-frequency signal is further attenuated by the high-frequency filter 12, and the noise-attenuated high-frequency signal is output to the demultiplexing circuit 10A1. The high-frequency signal is then output to the directional coupler 11A from the demultiplexing circuit 10A1. The high-frequency signal is then output to the antenna terminal ANT1 from the directional coupler 11A.

Reception of a high-frequency signal of the 2.4-GHz band will be described.

A high-frequency signal is input to the antenna terminal ANT1 from an antenna (not illustrated). The high-frequency signal is input to the demultiplexing circuit 10A1 through the directional coupler 11A. The high-frequency signal is then output to the high-frequency filter 12 from the demultiplexing circuit 10A1. Noise in the high-frequency signal is attenuated by the high-frequency filter 12, and the noise-attenuated high-frequency signal is output to the lowpass filter 13A. Noise in the high-frequency signal is further attenuated by the lowpass filter 13A, and the noise-attenuated high-frequency signal is output to the terminal P41.

Transmission of a high-frequency signal of the 5-GHz band will be described.

A high-frequency signal is input to the high-frequency filter 10A2 from the terminal P42. The high-frequency filter 10A2 attenuates harmonics of the high-frequency signal input thereto from the terminal P42.

The high-frequency signal is then output to the demultiplexing circuit 10A1 through the integrated module FEM. At that time, the high-frequency signal is amplified using the power amplifier function of the integrated module FEM. The amplification factor used at that time is adjusted in accordance with a monitor signal. The high-frequency signal is then output to the directional coupler 11A from the demultiplexing circuit 10A1. The directional coupler 11A outputs the high-frequency signal to the antenna terminal ANT1.

Reception of a high-frequency signal of the 5-GHz band will be described.

A high-frequency signal is input to the antenna terminal ANT1 from an antenna (not illustrated). The high-frequency signal is input to the demultiplexing circuit 10A1 through the directional coupler 11A. The high-frequency signal is then output to the integrated module FEM from the demultiplexing circuit 10A1. The high-frequency signal is processed using the switch circuit function and the low-noise amplifier function of the integrated module FEM and is then output to the terminal P43. At that time, the high-frequency signal is amplified using the low-noise amplifier function of the integrated module FEM. The amplification factor used at that time is adjusted in accordance with a monitor signal.

As illustrated in FIG. 6B, a high-frequency module 1B includes bandpass filters 10B1 and 10B2, a directional coupler 11B, the high-frequency filter 12, a lowpass filter 13B, a matching circuit 14, an integrated module FEM, antenna terminals ANT2 and ANT3, terminals P41, P42, P43, P44, P45, P46, and P47, the resistor 15, and the capacitor 16.

The bandpass filters 10B1 and 10B2 have the configuration according to the embodiment described above. Each of the bandpass filters 10B1 and 10B2 corresponds to a "high-frequency filter" according to an aspect of the present disclosure. Note that it is sufficient that at least the bandpass filter 10B1 has the configuration according to the embodiment described above.

The directional coupler 11B corresponds to a "second directional coupler" according to an aspect of the present disclosure. The high-frequency filter 12 corresponds to a "first-frequency-band high-frequency filter" according to an aspect of the present disclosure. In addition, the bandpass filter 10B1 corresponds to a "third-frequency-band high-frequency filter" according to an aspect of the present disclosure, and the bandpass filter 10B2 corresponds to a "fourth-frequency-band high-frequency filter" according to an aspect of the present disclosure.

The lowpass filter 13B is a lowpass filter for a 2.4-GHz band. The lowpass filter 13B may further include a high-frequency matching circuit desirably. The lowpass filter 13B corresponds to a "third lowpass filter" according to an aspect of the present disclosure.

The integrated module FEM includes one or a plurality of semiconductor elements. The integrated module FEM has functions of a switch circuit, a power amplifier, and a low-noise amplifier, for example.

The antenna terminal ANT2 is an antenna terminal for the 2.4-GHz band. The antenna terminal ANT3 is an antenna terminal for the 5-GHz band. The antenna terminal ANT2 corresponds to a "second antenna terminal" according to an aspect of the present disclosure, and the antenna terminal ANT3 corresponds to a "third antenna terminal" according to an aspect of the present disclosure.

The terminal P41 is a transmission/reception terminal for the 2.4-GHz band. The terminal P42 is a transmission terminal for the 5-GHz band, and the terminal P43 is a reception terminal for the 5-GHz band.

The antenna terminals ANT2 and ANT3 are connected to the directional coupler 11B. The directional coupler 11B is connected to the matching circuit 14 and the bandpass filter 10B1. The directional coupler 11B is also connected to the resistor 15. With such a configuration, a detection circuit (monitor circuit) of a high-frequency signal that is input to and output from the antenna terminals ANT2 and ANT3 is implemented.

The matching circuit 14 is connected to the high-frequency filter 12. The high-frequency filter 12 is connected to the lowpass filter 13B. The lowpass filter 13B is connected to the terminal P41.

The bandpass filter 10B1 is connected to the integrated module FEM. The integrated module FEM is connected to the bandpass filter 10B2, the terminals P43, P44, P45, and P46, and the capacitor 16. The bandpass filter 10B2 is connected to the terminal P42.

Transmission of a high-frequency signal of the 2.4-GHz band will be described.

A high-frequency signal is input to the lowpass filter 13B from the terminal P41. The lowpass filter 13B attenuates harmonics of the high-frequency signal input thereto from the terminal P41.

Noise in the high-frequency signal is further attenuated by the high-frequency filter 12, and the noise-attenuated high-frequency signal is output to the directional coupler 11B through the matching circuit 14. The high-frequency signal is then output to the antenna terminal ANT2 from the directional coupler 11B.

Reception of a high-frequency signal of the 2.4-GHz band will be described.

A high-frequency signal is input to the antenna terminal ANT2 from an antenna (not illustrated). The high-frequency signal is input to the matching circuit 14 through the directional coupler 11B. The high-frequency signal is then output to the high-frequency filter 12 from the matching circuit 14. Noise in the high-frequency signal is attenuated by the high-frequency filter 12, and the noise-attenuated high-frequency signal is output to the lowpass filter 13B. Noise in the high-frequency signal is then attenuated by the lowpass filter 13B, and the noise-attenuated high-frequency signal is output to the terminal P41.

Transmission of a high-frequency signal of the 5-GHz band will be described.

A high-frequency signal is input to the bandpass filter 10B2 from the terminal P42. The bandpass filter 10B2 attenuates harmonics of the high-frequency signal input thereto from the terminal P42.

The high-frequency signal is output to the bandpass filter 10B1 through the integrated module FEM. At that time, the high-frequency signal is amplified using the power amplifier function of the integrated module FEM. The amplification factor used at that time is adjusted in accordance with a monitor signal. The high-frequency signal is then output to the directional coupler 11B from the bandpass filter 10B1. The directional coupler 11B outputs the high-frequency signal to the antenna terminal ANT3.

Reception of a high-frequency signal of the 5-GHz band will be described.

A high-frequency signal is input to the antenna terminal ANT3 from an antenna (not illustrated). The high-frequency signal is input to the bandpass filter 10B1 through the directional coupler 11B. The high-frequency signal is then output to the integrated module FEM from the bandpass filter 10B1. The high-frequency signal is processed using the switch circuit function and the low-noise amplifier function of the integrated module FEM and is then output to the terminal P43. At that time, the high-frequency signal is amplified using the low-noise amplifier function of the integrated module FEM. The amplification factor used at that time is adjusted in accordance with a monitor signal.

With the use of the high-frequency filter having the configuration according to the embodiment described above as the high-frequency filters of such high-frequency modules 1A and 1B, transmission/reception characteristics of the high-frequency modules 1A and 1B improve.

As described above, the high-frequency filter 12 is an elastic wave filter and may be, for example, a surface acoustic wave (SAW) filter or a bulk acoustic wave (BAW) filter.

In the case where the high-frequency filter 12 is a SAW filter, the high-frequency filter 12 includes a substrate and interdigital transducer (IDT) electrodes.

The substrate of the high-frequency filter 12 (hereinafter, simply referred to as a substrate) is a multilayer substrate having piezoelectricity at least partially (on the surface, for example). For example, the substrate may be a multilayer substrate made of a multilayer body of a piezoelectric thin film on the surface, a film with an acoustic velocity different from that of the piezoelectric thin film, and a support substrate or the like.

A multilayer substrate having piezoelectricity at least partially refers to a substrate including a high-acoustic-velocity support substrate through which a bulk wave propagates at an acoustic velocity higher than the acoustic velocity of an elastic wave that propagates through a piezoelectric thin film, a low-acoustic-velocity film that is stacked on the high-acoustic-velocity support substrate and through which a bulk wave propagates at an acoustic velocity lower than the acoustic velocity of an elastic bulk wave that propagates through the piezoelectric thin film, and the piezoelectric thin film stacked on the low-acoustic-velocity film. Note that the high-acoustic-velocity support substrate serves as a high-acoustic-velocity film and a support substrate (described later).

In addition to the configuration described above, the substrate may be a multilayer substrate that has piezoelectricity at least partially and that includes a support substrate, a high-acoustic-velocity film which is disposed on the support substrate and through which a bulk wave propagates at an acoustic velocity higher than the acoustic velocity of an elastic wave that propagates through a piezoelectric thin film, and the piezoelectric thin film stacked on the high-acoustic-velocity film. In addition, the substrate may be made of a multilayer body including a low-acoustic-velocity film through which a bulk wave propagates at an acoustic velocity lower than the acoustic velocity of an elastic bulk wave that propagates through a piezoelectric thin film and the piezoelectric thin film stacked on the low-acoustic-velocity film.

In addition, the whole substrate may have piezoelectricity. In this case, the substrate is a piezoelectric substrate constituted by a single piezoelectric layer.

The IDT electrodes can be composed of an appropriate metal material, such as Al, Cu, Pt, Au, Ag, Ti, Ni, Cr, Mo, W or an alloy containing any one of these metals as its main constituent. In addition, the IDT electrodes may have a structure in which a plurality of metal films of some of these metals or alloys are stacked.

The piezoelectric thin film is composed of any of lithium tantalate (LiTaO$_3$), lithium niobate (LiNbO$_3$), ZnO, aluminum nitride (AlN), or PZT.

The low-acoustic-velocity film is composed of any of silicon oxide, glass, silicon oxynitride, tantalum oxide, a compound obtained by adding fluorine, carbon, or boron to silicon oxide, or a material containing any of the above materials as its main constituent.

The high-acoustic-velocity support substrate is composed of a piezoelectric body, such as aluminum nitride, aluminum oxide, silicon carbide, silicon nitride, silicon, sapphire, lithium tantalate, lithium niobate, or crystal; various kinds of ceramic material, such as alumina, zirconia, cordierite, mullite, steatite, or forsterite; magnesia diamond; a material containing any of the foregoing materials as its main constituent; or a material containing a mixture of any of the foregoing materials as its main constituent.

The high-acoustic-velocity film is composed of a piezoelectric material, such as a diamond-like carbon (DLC) film, aluminum nitride, aluminum oxide, silicon carbide, silicon nitride, silicon, sapphire, lithium tantalate, lithium niobate, or crystal; various kinds of ceramic material, such as alumina, zirconia, cordierite, mullite, steatite, or forsterite; magnesia diamond; a material containing any of the above materials as its main constituent; or a material containing a mixture of any of the above materials as the main constituent.

For the support substrate, a piezoelectric material, such as sapphire, lithium tantalate, lithium niobate, or crystal; various kinds of ceramic material, such as alumina, magnesia, silicon nitride, aluminum nitride, silicon carbide, zirconia, cordierite, mullite, steatite, or forsterite; a dielectric body such as glass or a semiconductor such as silicon or gallium nitride, or a resin substrate can be used.

When $\lambda$ denotes the wavelength of an elastic wave determined by the period of electrode fingers of the IDT electrodes, the piezoelectric thin film desirably has a film thickness of 3.5$\lambda$ or less because the Q factor increases. In addition, the film thickness of 2.5$\lambda$ or less improves temperature characteristics (TCF). Further, the film thickness of 1.5$\lambda$ or less makes adjustment of the acoustic velocity easier.

When $\lambda$ denotes the wavelength of an elastic wave determined by the period of electrode fingers of the IDT electrodes, the low-acoustic-velocity film desirably has a film thickness of 2.0$\lambda$ or less. With the film thickness of the low-acoustic-velocity film that is less than or equal to 2.0$\lambda$, film stress is successfully reduced. As a result, a curvature of the wafer is successfully reduced, resulting in an increased percentage of non-defective products and stabilized characteristics. In addition, if the film thickness of the low-acoustic-velocity film is in a range from 0.1$\lambda$ to 0.5$\lambda$, an electromechanical coupling coefficient hardly changes regardless of the material of the high-acoustic-velocity film.

Since the high-acoustic-velocity film has a function of confining an elastic wave in the piezoelectric thin film and the low-acoustic-velocity film, a greater film thickness of the high-acoustic-velocity film is more desirable. With the film thickness of the high-acoustic-velocity film that is greater than or equal to 0.3$\lambda$, approximately 100% energy concentration at a resonance point is successfully accomplished. Further, with the film thickness of the high-acoustic-velocity film that is greater than or equal to 0.5$\lambda$, approximately 100% energy concentration at an anti-resonance point is successfully accomplished, and better device characteristics can be obtained.

While preferred embodiments of the disclosure have been described above, it is to be understood that variations and modifications will be apparent to those skilled in the art without departing from the scope and spirit of the invention. The scope of the invention, therefore, is to be determined solely by the following claims.

What is claimed is:

1. A high-frequency filter comprising:
   a first terminal;
   a second terminal;
   a third terminal;
   a first inductor;
   a second inductor;
   a third inductor;
   a fourth inductor;
   a first capacitor;
   a second capacitor;
   a third capacitor;
   a fourth capacitor; and a fifth capacitor, wherein:
the first inductor and the second inductor are connected in series to each other between the first terminal and the second terminal,
the third inductor and the fourth inductor are connected in parallel to each other between the third terminal and a node connecting the first inductor and the second inductor,
the connection between the first inductor and the second inductor is an additive polarity connection,
the connection between the third inductor and the fourth inductor is an additive polarity connection,
the first capacitor is connected between the first inductor and the first terminal,
the second capacitor is connected between the second inductor and the second terminal,
the third capacitor is connected between the third terminal and a node between the first capacitor and the first inductor,
the fourth capacitor is connected between the third terminal and a node between the second capacitor and the second inductor, and
the fifth capacitor is connected between the third terminal and a node between the third inductor and the fourth inductor.

2. The high-frequency filter according to claim 1, further comprising:
a multilayer body including a plurality of dielectric layers stacked on top of each other and having a first principal surface and a second principal surface, a stacking direction being normal to the first principal surface and the second principal surface; and
conductor patterns disposed in or on the multilayer body, wherein
the first terminal, the second terminal, the third terminal, the first inductor, the second inductor, the third inductor, the fourth inductor, the first capacitor, the second capacitor, the third capacitor, the fourth capacitor, and the fifth capacitor are constituted by the conductor patterns,
the first terminal is disposed at a portion of the multilayer body nearer to the first principal surface than the second terminal,
the second terminal is disposed at a portion of the multilayer body nearer to the second principal surface than the first terminal,
the third terminal is connected to conductor patterns having a reference potential,
the first capacitor includes a first planar conductor and a second planar conductor that are spaced apart from each other and oppose each other in the stacking direction,
the second capacitor includes a third planar conductor and a fourth planar conductor that are spaced apart from each other and oppose each other in the stacking direction,
the third capacitor includes a fifth planar conductor and a sixth planar conductor that are spaced apart from each other and oppose each other in the stacking direction,
the fourth capacitor includes a seventh planar conductor and an eighth planar conductor that are spaced apart from each other and oppose each other in the stacking direction,
the fifth capacitor includes a ninth planar conductor and a tenth planar conductor that are spaced apart from each other and oppose each other in the stacking direction,
the first terminal is connected to the first planar conductor,
a first end of the first inductor is connected to the second planar conductor,
a second end of the first inductor is connected to a first end of the second inductor, a first end of the third inductor, and a first end of the fourth inductor,
a second end of the second inductor is connected to the fourth planar conductor,
the second terminal is connected to the third planar conductor,
the fifth planar conductor is disposed on a side opposite to the second planar conductor with respect to the first planar conductor,
the sixth planar conductor serves as a conductor pattern having the reference potential and is disposed on the first principal surface or disposed to be closer to the first principal surface than the fifth planar conductor,
the seventh planar conductor is disposed on a side opposite to the fourth planar conductor with respect to the third planar conductor,
the eighth planar conductor serves as a conductor pattern having the reference potential and is disposed on the second principal surface or disposed to be closer to the second principal surface than the seventh planar conductor,
a second end of the third inductor and a second end of the fourth inductor are connected to the ninth planar conductor,
the tenth planar conductor serves as a conductor pattern having the reference potential and is disposed on the second principal surface or disposed to be closer to the second principal surface than the ninth planar conductor,
a direction of a magnetic flux produced by the first inductor is substantially similar to a direction of a magnetic flux produced by the second inductor, and
a direction of a magnetic flux produced by the third inductor is substantially opposite to a direction of a magnetic flux produced by the fourth inductor.

3. The high-frequency filter according to claim 2, wherein
the first inductor and the second inductor have helical shapes having a winding axis in the stacking direction, the first inductor and the second inductor having the same winding directions, and
the third inductor and the fourth inductor have helical shapes having a winding axis in the stacking direction, the third inductor and the fourth inductor having opposite winding directions.

4. The high-frequency filter according to claim 2, wherein the ninth planar conductor is disposed between the eighth planar conductor and the tenth planar conductor in the stacking direction.

5. The high-frequency filter according to claim 2, wherein according to a plan view of the multilayer body, the first planar conductor, the second planar conductor, the third planar conductor, and the fourth planar conductor are disposed between a region where the first inductor and the second inductor are disposed and a region where the third inductor and the fourth inductor are disposed.

6. The high-frequency filter according to claim 2, wherein
the first end of the third inductor is connected to the second end of the first inductor and the first end of the second inductor by a first wiring conductor pattern,
the first end of the fourth inductor is connected to the second end of the first inductor and the first end of the second inductor by a second wiring conductor pattern, and the first wiring conductor pattern and the second wiring conductor pattern are parallel to each other in the stacking direction.

7. A high-frequency filter comprising:
a first terminal;
a second terminal;
a third terminal;
a first inductor;
a second inductor;
a third inductor;
a fourth inductor;
a multilayer body including a plurality of dielectric layers stacked on top of each other and having a first principal surface and a second principal surface, a stacking direction being normal to the first principal surface and the second principal surface; and
conductor patterns disposed in or on the multilayer body, wherein:
the first inductor and the second inductor are connected in series to each other between the first terminal and the second terminal,
the third inductor and the fourth inductor are connected in parallel to each other between the third terminal and a node connecting the first inductor and the second inductor,
the connection between the first inductor and the second inductor is an additive polarity connection,
the connection between the third inductor and the fourth inductor is an additive polarity connection,
the first terminal, the second terminal, the third terminal, the first inductor, the second inductor, the third inductor, and the fourth inductor are constituted by the conductor patterns,
the first terminal is disposed at a portion of the multilayer body nearer to the first principal surface than the second terminal,
the second terminal is disposed at a portion of the multilayer body nearer to the second principal surface than the first terminal,
the third terminal is connected to conductor patterns having a reference potential,
a first end of the first inductor is connected to the first terminal,
a second end of the first inductor is connected to a first end of the second inductor, a first end of the third inductor, and a first end of the fourth inductor,
a second end of the second inductor is connected to the second terminal,
a second end of the third inductor and a second end of the fourth inductor are connected to the conductor patterns having the reference potential,
a direction of a magnetic flux produced by the first inductor is substantially similar to a direction of a magnetic flux produced by the second inductor, and
a direction of a magnetic flux produced by the third inductor is substantially opposite to a direction of a magnetic flux produced by the fourth inductor.

8. The high-frequency filter according to claim 1, wherein
the first inductor and the second inductor have helical shapes having a winding axis in the stacking direction, the first inductor and the second inductor having the same winding directions, and
the third inductor and the fourth inductor have helical shapes having a winding axis in the stacking direction, the third inductor and the fourth inductor having opposite winding directions.

9. A high-frequency module comprising:
a first diplexer including the high-frequency filter according to claim 1 and a first lowpass filter;
a first antenna terminal;
a first directional coupler;
a first-frequency-band high-frequency filter;
a second-frequency-band high-frequency filter;
a second lowpass filter; and
an integrated module including at least one semiconductor element.

10. The high-frequency module according to claim 9, wherein the first-frequency-band high-frequency filter is a bulk acoustic wave filter.

11. The high-frequency module according to claim 9, wherein
the first directional coupler is connected to the first antenna terminal,
the first diplexer is connected to the first directional coupler,
the first-frequency-band high-frequency filter is connected to the first lowpass filter,
the second lowpass filter is connected to the first-frequency-band high-frequency filter,
the integrated module is connected to the high-frequency filter of the first diplexer, and
the second-frequency-band high-frequency filter is connected to the integrated module.

12. The high-frequency module according to claim 9, wherein the first-frequency-band high-frequency filter is a surface acoustic wave filter including a multilayer substrate at least partially having piezoelectricity.

13. A high-frequency module comprising:
a second antenna terminal;
a third antenna terminal;
a second directional coupler;
a first-frequency-band high-frequency filter;
a third-frequency-band high-frequency filter according to claim 1;
a fourth-frequency-band high-frequency filter;
a third lowpass filter; and
an integrated module including at least one semiconductor element.

14. The high-frequency module according to claim 13, wherein
the second directional coupler is connected to the second antenna terminal and the third antenna terminal,
the first-frequency-band high-frequency filter and the third-frequency-band high-frequency filter are connected to the second directional coupler,
the third lowpass filter is connected to the first-frequency-band high-frequency filter,
the integrated module is connected to the third-frequency-band high-frequency filter, and
the fourth-frequency-band high-frequency filter is connected to the integrated module.

15. The high-frequency module according to claim 13, wherein the first-frequency-band high-frequency filter is a bulk acoustic wave filter.

16. The high-frequency module according to claim 13, wherein the first-frequency-band high-frequency filter is a surface acoustic wave filter including a multilayer substrate at least partially having piezoelectricity.

* * * * *